United States Patent [19]
Fensch et al.

[11] Patent Number: 5,751,775
[45] Date of Patent: May 12, 1998

[54] TRANSMISSION CIRCUIT OF A LINE ENCODED SIGNAL ON A TELEPHONE LINE

[75] Inventors: Thierry Fensch, Grenoble, France; Jan Sevenhans, Brasschaat, Belgium

[73] Assignee: SGS-Thomson Microelectronics S.A., Saint Genis, France

[21] Appl. No.: 423,579

[22] Filed: Apr. 18, 1995

[30] Foreign Application Priority Data

Apr. 29, 1994 [FR] France ............... 94 05500

[51] Int. Cl.⁶ .............. H04L 7/00; H04L 25/36; H04L 25/40
[52] U.S. Cl. ......................... 375/371; 375/376
[58] Field of Search .................. 375/371, 376, 375/219

[56] References Cited

U.S. PATENT DOCUMENTS

| | | | |
|---|---|---|---|
| 5,103,464 | 4/1992 | Capkun et al. | 375/106 |
| 5,386,437 | 1/1995 | Yasuda | 375/120 |
| 5,388,122 | 2/1995 | Kawada et al. | 375/8 |
| 5,399,995 | 3/1995 | Kardontchik et al. | 331/17 |
| 5,423,075 | 6/1995 | Boese et al. | 455/86 |
| 5,469,473 | 11/1995 | McClear et al. | 375/219 |
| 5,555,276 | 9/1996 | Koenck et al. | 375/303 |
| 5,561,692 | 10/1996 | Maitland et al. | 375/371 |

OTHER PUBLICATIONS

French Search Report for French Patent Application Number 9405500 filed Apr. 29, 1994.

IEEE Journal of Solid-State Circuits, vol. 25, No. 6, Dec. 1, 1990, New York US, pp. 1414–1425, Roy Batruni, et al. "Mixed Digital/Analog Signal Processing For a Single-Chip 2BIQ U-Interface Transceiver".

IEEE Journal of Solid-State Circuits, vol. 22, No. 2, Apr. 1, 1987, New York US pp. 255–261, Deog-Kyoon Jeong, et al. "Design of PLL-Based Clock Generation Circuits".

Nachrichtentechnische Berichte, No. 5, Nov. 1, 1988, Bachnang DE pp. 40–49, Volker Hespelt, et al. "Zur Synchronisation des Empfängers für den ISDN–Basisanschluss".

*Primary Examiner*—Stephen Chin
*Assistant Examiner*—Mohammad Ghayour
*Attorney, Agent, or Firm*—Wolf, Greenfield & Sacks, P.C.; James H. Morris

[57] ABSTRACT

A full duplex transmission circuit for a signal having alternating synchronization words with data words. The circuit comprising a phase-locked loop including a frequency synchronizer adapted to provide an emission clock signal. A sampling signal having its phase locked on the shift between an emitted signal and a received signal is generated using a clock signal provided by the phase-locked loop. The circuit includes circuitry for imparting to the frequency synchronizer a frequency multiplier function to reduce a duration of phase skips of the sampling signal.

40 Claims, 7 Drawing Sheets

TRANSMISSION CIRCUIT OF A LINE ENCODED SIGNAL ON A TELEPHONE LINE

BACKGROUND OF THE INVENTION

1. Field of the Invention

The present invention relates to a 160-kbit transmission circuit of encoded signals on a telephone line.

2. Discussion of the Related Art

Such a transmission circuit is designed for transmitting on a conventional two-wire telephone line, according to a so-called NUMERIS transmission mode (digital transmission with integrated services), speech, pictures or data. This circuit is integrated with line termination cards of telephone exchanges upstream a line transformer, on both ends of the telephone line. The NUMERIS transmission mode is based on a line encoding of the information which is transmitted according to a so-called 2B1Q standard at a 80-kHz frequency. This transmission standard has a capacity of 160 kbits/second and includes two 64-kbit/second channels referred to as B channels on which speech or data can flow indistinctly, and a 16kbit/second channel, referred to as a D channel, on which data are liable to flow. The remaining 16 kbits/second are used to transmit words required for the operation of the system.

Encoding of information according to the 2B1Q standard consists of transforming two successive binary codes into one of the four levels of a quaternary code thus allowing a 160-kbit/second flow at a 80-kHz frequency. FIG. 1 is a timing diagram of an exemplary encoding of a binary signal achieved according to the 2B1Q standard.

One of the four levels (3, 1, −1, −3) of the quaternary code corresponds to each successive pair of bits according to the following table:

| binary codes    | 10 | 11 | 01 | 00 |
|-----------------|----|----|----|----|
| quaternary codes| +3 | +1 | −1 | −3 |

The peak-to-peak amplitude of the quaternary signal is 5 volts for a NUMERIS transmission. Since the used frequency is 80 kHz, each quaternary code has a 12.5-µs width.

The quaternary codes are transmitted in a frame successively including, as shown by the timing diagram of FIG. 2, a synchronization word (SW) of 18 bits or 9 quaternary codes, 216 bits or 108 quaternary codes for the information (2B+D) corresponding to the two channels B and channel D, as well as 6 bits or 3 quaternary codes (OB) including indications that are needed for data decoding. A synchronization word, referred to as a super-frame word (SFW) is interposed every 8 synchronization words (SW). FIG. 2 is not drawn to scale for the sake of clarity, the length of a data word 2B+D being in fact much larger than the length of a synchronization word.

FIG. 3 is a diagram of a conventional transmission circuit in 2B1Q standard. Such a circuit is marketed by the applicant under reference ST5410.

The circuit includes an emission (Tx) unit 1 and a reception (Rx) unit 2. Units 1 and 2 are connected by their output and input, respectively, to a line transformer 3 acting as a U-interface between these units and a two-wire telephone line 4. The circuit also includes a phase-locked loop (FLL) 5 which is synchronized by an 8-kHz reference frequency available at the telephone exchange, as well as a data reception unit 6 and data transmission unit 7.

The data transmission unit 7 transforms a quaternary code message (Me) into an analog signal having an 80-kHz frequency, whose amplitude is modulated by the line encoding of the message "e" to transmit.

The reception unit 6 includes an analog-to-digital (A/D) converter 8 sampled at an 80-kHz frequency, and a circuit 9 for the detection of the received data. Circuit 9 includes a self-adaptable signal processor for the suppression of echoes due to the full duplex transmission on the line and for restoring information in the binary form ("Ms"). The reception unit 6 also includes a line delay counter 10, an arithmetic and logic unit (ALU) 11 and a decoder 12 whose operation will be explained hereinafter.

Since information is transmitted in full duplex mode, the reception unit 6 must be capable of dissociating the signal emitted with approximately a 5-volt amplitude from the received signal, which is highly attenuated (by approximately 40 dB) by the line and has an amplitude of approximately 30 mV only. The dissociation is made by calculating the phase difference between the emitted signal and the received signal. This difference depends upon the configuration of the line, and its initial value is measured by unit 6 during the transient training phase.

A first problem raised by this type of transmission is the need for servocontrolling the phase of the sampling signal as a function of the jitter of the received signal in steady state with respect to the initial phase shift measured during the initial training state. This jitter is, for example, due to temperature variations of the line.

A second problem lies in the need for sampling the signal near its peak value to prevent the information from being mistaken for an echo due to the low amplitude of the received signals.

These constraints require the provision of a clock with a high frequency with respect to the 80-kHz sampling signal to position the edges of the sampling signal near the peak values of the received signal. Moreover, all the clocks of the circuit are synchronized with the 8-kHz reference frequency which is available at the telephone exchange.

To achieve this purpose, the circuit represented in FIG. 3 includes, in its PLL 5, a comparison and loop filter unit 13 whose first input receives an 8-kHz reference clock signal. Unit 13 provides to a frequency synchronizing circuit 14 both an 8-kHz square wave clock signal (CLKO) and two signals indicating the result of the comparison between the reference frequency and an 8-kHz clock signal which is synthesized back by the PLL and provided to the second input of the comparison unit 13. The first signal (AV/RET) indicates the advance or the lag of the 8-kHz clock signal with respect to the reference frequency. The second signal (GEL) indicates the locking of the loop, that is, whether there is a phase shift between the two inputs of the comparison unit 13.

The frequency synchronization circuit 14 receives, in addition to the three signals AV/RET, GEL, and CLKO, a clock signal provided by a quartz cell which is formed by two capacitors C1 and C2 and by a 15.36-MHz quartz X. Circuit 14 provides a 15.36-MHz signal CLK1 synchronized with the 8-kHz frequency (CLK0).

Details of the structure of circuit 14 are schematically represented in FIG. 4. Circuit 14 includes a 19-stage ring oscillator 16. The oscillator 16 includes 19 inverters I(i), the output of an inverter I(i) being connected to the input of the next inverter I(i+1) and the output of the last inverter I(19) being connected to the input of the first inverter I(1). The frequency and the phase of the ring oscillator is locked on the clock provided by quartz X, by a phase-locked loop (PLL) described hereinafter.

The PLL includes a comparator 17 having a first input that receives a 15.36-MHz clock signal generated by the quartz cell. The two terminals of quartz X are connected in parallel to a resistor R1 and an inverter I whose output provides the 15.36-MHz clock signal. A second input of comparator 17 receives the signal generated by the last inverter I(19) of oscillator 16. Either one of the two outputs of comparator 17, depending on the direction of the phase shift between the inputs, provides a signal whose duration depends upon the amplitude of the phase difference. Each of these outputs is connected to the gate of MOS transistors, T1 and T2, respectively. The MOS transistor T1 is a P-channel transistor and the MOS transistor T2 is an N-channel transistor. The source of transistor T1 is connected to a high supply voltage "Vdd". The source of transistor T2 is connected to a low supply voltage (ground). The common drain of transistors T1 and T2 is connected, through a loop filter circuit 18 constituted by resistors R2 and R3 and by capacitor C3, to the first terminal of a capacitor C4 whose second terminal is grounded. Thus, capacitor C4 is loaded or unloaded depending on the direction of the phase shift at the inputs of comparator 17. The voltage across capacitor C4 is converted into a current by a current-voltage converter 19. Converter 19 includes, for example, an operational amplifier AI, a resistor R4 and a P-channel MOS transistor T3 that are connected in series between the supply voltage Vdd and ground, the circuit being connected as represented in FIG. 4. The current flowing through the MOS transistor T3 is duplicated by P-channel MOS transistors T4, which are used for biasing the inverters I(i) of the ring oscillator 16. The circuit is stabilized when the frequency and the phase of the ring oscillator 16 are the same as those of the quartz oscillator.

In a preferred embodiment, a 19-stage ring oscillator is used because the 3.4 ns average delay caused by each inverter I(i), in a specific technology of fabrication, results in a 65 ns period corresponding to the 15.36-MHz frequency.

The synchronization of the 15.36-MHz frequency with the 8-kHz clock signal CLK0 is achieved with a shift register 20 of the circulating "1" type. Register 20 is used to select the output of inverter I(i) from which signal CLK1 is drawn. The shift register 20 is controlled by the 8-kHz clock signal CLK0. Register 20 is initialized by a "1" in one of its 19 flip-flops B(j), the other flip-flops being initialized at "0", and the shift control is achieved by signals AV/RET and GEL of comparator 13. The state of each flip-flop B(j) is transmitted to control a switch K(i) of a multiplexer 21 which selects the output of the inverter I(i) from which signal CLK1 is drawn.

In fact, the states of two adjacent flip-flop B(j) and B(j+1) are transmitted to control two non-adjacent switches K(i) and K(i+2). Thus, signal CLK1 is either delayed or advanced, respectively, by 6.8 ns (corresponding to the propagation time of two inverters of ring 16 ) each time the circulating "1" is shifted from a flip-flop B(j) to an adjacent flip-flop B(j+1) or B(j−1), respectively.

Referring back to FIG. 3, the signal CLK1 generated by the synchronization circuit 14 is provided to the input of an 8-bit counter 15 designed to operate as a divider by 192 . Accordingly, counter 15 provides an 80 kHz clock signal (CLK2) which is synchronized with the 8 kHz frequency. Signal CLK2 forms the emission clock of the data emitting unit 7, as well as the clock of the line delay counter 10 of the data reception unit 6.

Counter 10 contains, on 8 bits, an indication of the phase shift between the emitted information and the received information. Counter 10 is initialized during the training step on the initial value of this phase error predominantly due to the length of the line. Then, in steady state, counter 10 corrects this value when a phase error occurs with respect to this initial phase shift. For this purpose, an up/down input of counter 10 is controlled by a phase error signal "e" provided by the detection circuit 9. In fact, signal "e" represents the enabling of the up/down counting as soon as the signal processor of circuit 9 detects, in steady state, a variation of the received signal phase with respect to the preceding phase shift value contained in counter 10. The up/down counting frequency corresponds to 1:8 of the 80 kHz frequency, i.e., 10 kHz, the value of counter 10 may then change every 0.1 ms. In practice, the line delay counter 10 is a 16-bit counter, 8 bits of which only are used for operating the circuit.

The value of counter 10 is "added" by ALU 11 to the 8 bits provided by counter 15. Since this value does not change during the 192 65-ns steps of counter 15 (corresponding to the 80-kHz frequency), ALU 11 thus contains, for each state of counter 15, i.e., every 65 ns, the value of the phase shift contained in counter 10.

The 9-bit result of ALU 11 is provided to decoder 12 which is controlled by the 15.36-MHz clock signal CLK1. Decoder 12 provides the 80-kHz sampling signal (CLK3) to the A/D converter 8. The width of the sampling pulses is determined by the 15.36-MHz frequency which controls decoder 12; accordingly, the width is 65 ns. The sampling signal CLK3 is furthermore shifted with respect to signal CLK2 by the value contained in counter 10 and provided by ALU 11 at each state of counter 15.

If the state of counter 10 changes by 1, every state of the ALU 11 changes by 1. Thus, decoder 12 provides a phase skip having an amplitude of 65 ns (corresponding to the 15.36-MHz frequency) on the sampling signal phase CLK3. The direction of the phase skip is determined by the polarity of signal "e" which sets counter 10 either to up-counting or down-counting.

To allow the A/D converter 8 to correctly sample the signal so that the echo cancellation processor properly operates, decoder 12 locks the sampling signal on the detection of states 56 and 248 of the signals provided by ALU 11. This means, for a code emitted at a 80-kHz frequency, i.e., with a width of 12.5 μs, that sampling is carried out 56×65 ns=3.64 μs after the beginning of the code. This value is thus determined to allow the echo cancellation processor to properly operate.

FIG. 5 is a timing diagram, not drawn to scale for the sake of clarity, of the position of a received code "Sr" with respect to the position of an emitted code "Se". The value of the phase shift between the two signals is φ. The pulses of the sampling signal have a 64-ns width (corresponding to the 15.36-MHz frequency). The peak values of these pulses are at φ+3.64 μs from the beginning of the emitted code.

A drawback of such a circuit lies in that the width of the phase skips of the sampling frequency is too important to allow optimal detection by the signal processor. Indeed, at the occurrence of a phase error, the larger the width of the phase skip, the higher is the risk for the A/D converter 8 to sample the code currently received at a wrong value and to cause the message to be erroneously restored.

Another drawback of the prior art is that the phase skips of the sampling signal are introduced on any arbitrary quaternary code received according the 2B1Q standard. These phase skips may generate an erroneous interpretation of data by the signal processor and, accordingly, erroneous interpretations of communications. Since several bauds are required by the echo suppression signal processor to optimally converge back, it follows that the error may affect several codes. Indeed, since a phase skip causes the signal processor to diverge on a quaternary code of one of the data channels, the risk is that it may cause not only an erroneous interpretation of this code due to the phase shift in the sampling position on this code, but also of subsequent codes until the processor correctly reconverges.

SUMMARY OF THE INVENTION

An object of the present invention is to avoid the above drawback by reducing the width of the phase skips with as few modifications as possible to the transmission circuit.

Another object of the present invention is to avoid the drawbacks of the prior art circuit by positioning the phase skips on the synchronization words of the received signal in the 2B1Q standard, without using other components than those constituting the prior art circuit.

To achieve these objects, the present invention provides a full duplex transmission circuit of a signal encoded according to lines and frames having synchronization words alternating with data words, comprised of a PLL adapted to provide an emission clock signal synchronized with a reference frequency of the type including a frequency synchronizer and a frequency counter/divider; a sampling signal of an analog-to-digital converter whose phase is locked on the shift between the emitted signal and the received signal, being provided, at a reception side, using a clock signal provided to a decoder, by the loop synchronizer, and including circuitry for imparting to the frequency synchronizer the function of a frequency multiplier to reduce the duration of the possible phase skips of the sampling signal.

According to an embodiment of the invention, the circuitry includes a logic gate adapted to achieve a combination of the "Exclusive-OR" of two signals, having their phases mutually shifted, and originating from a ring oscillator of the frequency synchronizing and multiplying circuit.

According to an embodiment of the invention, the selection of the phase shift between the two outputs of the ring oscillator is achieved by a multiplexer controlled by a shift register of the circulating "1" type.

According to an embodiment of the invention, the ring oscillator includes n inverters, biased by a current generated by a loop controlling the phase with respect to a signal provided by a quartz. The multiplexer includes two series of n switches, each respectively drawing an output from the ring oscillator, the control of a switch of the first series, drawing the output signal of the oscillator from an inverter, corresponding to the control of a switch of the second series which draws the output signal of the oscillator from an inverter having, with respect to the signal, a delay corresponding to the propagation time of the signal in m inverters. The shift register includes n flip-flops, the state of two adjacent flip-flops respectively constituting the control signal, in each series, of two non-adjacent switches, so that the clock signal provided by the logic gate has a frequency equal to twice the quartz frequency.

According to an embodiment of the invention, the shift register is controlled by the reference clock signal, and the shift of state "1" from a flip-flop to the next or preceding flip-flop is controlled by a signal provided by a comparator of the PLL, to synchronize the clock signal of the decoder on the reference clock signal.

According to an embodiment of the invention, the circuit for positioning more particularly includes a decoder which provides the analog-to-digital converter with the sampling signal using the result calculated by an arithmetic and logic unit, which sums the value of a frequency counter/divider of a PLL with the value of a line delay counter. The line delay counter contains the value of the phase shift between the emitted signal and the received signal, its up/down counting frequency corresponding to a frequency of the synchronization words of the frame.

According to an embodiment of the invention, the line delay counter receives at its clock input, a signal having, at each synchronization word, a pulse whose width corresponds to the width of a received code, a frequency of occurrence of this pulse corresponding to the frequency of the synchronization words on the frame, and, at its up/down counting input, a signal "e" indicating the presence and direction of a phase error, these two signals being provided by a circuit for detecting the received signal.

According to an embodiment of the invention, the pulse of the clock signal of the line delay counter is provided upon the occurrence of a first code of each synchronization word.

According to an embodiment of the invention, the circuit is applied to the transmission at 160 kbits/second of a line signal encoded in quaternary codes according to the 2B1Q standard.

According to an embodiment of the invention, the ring oscillator includes 19 inverters, the multiplexer and the shift register including two series of 19 switches and 19 flip-flops, respectively, the phase shift between the two signals corresponding to the propagation time in four inverters; the emitting and sampling frequencies are 80 kHz, the frequency of the clock signal of the decoder being 30.72 MHz. The frequency of the clock signal provided by the detection circuit is approximately 666.6 Hz, the width of the sampling pulses and of the phase skips being 32.5 ns.

Imparting, according to the invention, a frequency multiplying function to the frequency synchronizing circuit makes it possible to provide to the decoder a 30.72 MHz frequency and accordingly to halve the duration of the phase skips of the sampling frequency.

In addition, this result is achieved with very few modifications to the circuit since, practically, only the multiplexer is modified.

Such a structure also halves the duration of the sampling pulses, which further increases the detection reliability of the transmission circuit.

Supplying, according to the invention, the line delay counter with a clock locked by the detection circuit upon the occurrence of a synchronization word causes that the phase skips, in steady state, are positioned in the 2B1Q standard at the synchronization words. Thus, the occurrence of any phase skip during the three information words 2B+D containing these data is avoided, which substantially limits transmission errors.

The positioning of the phase skips on the synchronization words is justified by the fact that this field is less sensitive. Indeed, six successive erroneous synchronization words must be detected before the circuit is desynchronized and, in practice, a phase skip in steady phase can occur only every 10 frames, i.e., every 10 synchronization words.

Accordingly, the available safety margin is quite sufficient to avoid desynchronization, while suppressing the risk of an erroneous interpretation of data.

Locking the clock of the line delay counter on the first quaternary code of the synchronization word optimizes this reliability. Indeed, since the signal processor requires several bauds to optimally reconverge, the processor no longer risks to end its convergence on the beginning of a date word. The processor can use the 8 next codes of the synchronization word, which includes 9 codes, to reconverge, which is in practice sufficient.

Thus, according to the present invention, the operation of the circuit is optimized, without substantially increasing the number of components, and therefore the manufacturing cost is reduced.

The foregoing and other objects, features, aspects and advantages of the invention will become apparent from the following detailed description of the present invention when taken in conjunction with the accompanying drawings.

BRIEF DESCRIPTION OF DRAWINGS

In FIGS. 3, 4, 6, and 8, the same elements are labelled with the same references.

DETAILED DESCRIPTION

Figure 1:
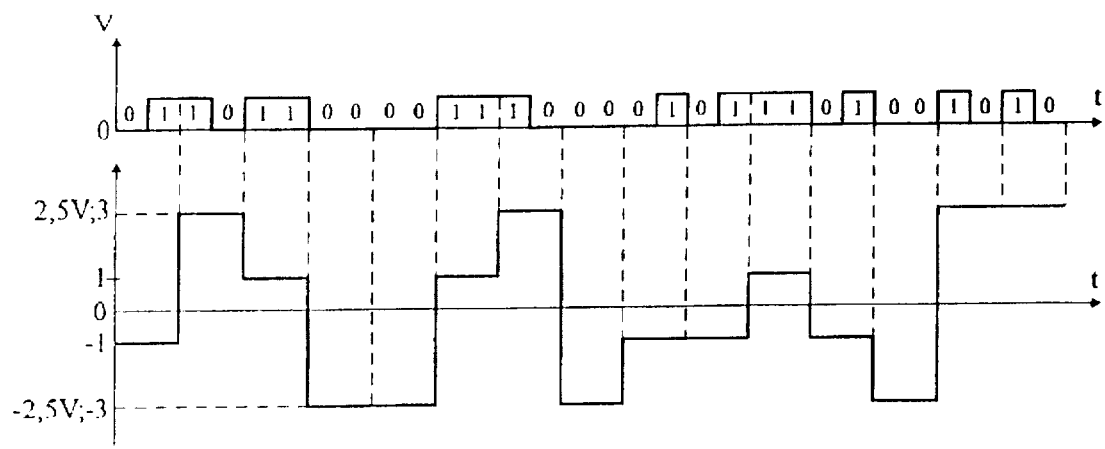
FIGS. 1–5, above described, illustrate the state of the art and the problem encountered.
Figure 2:
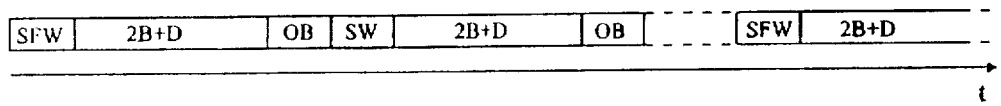
Figure 5:
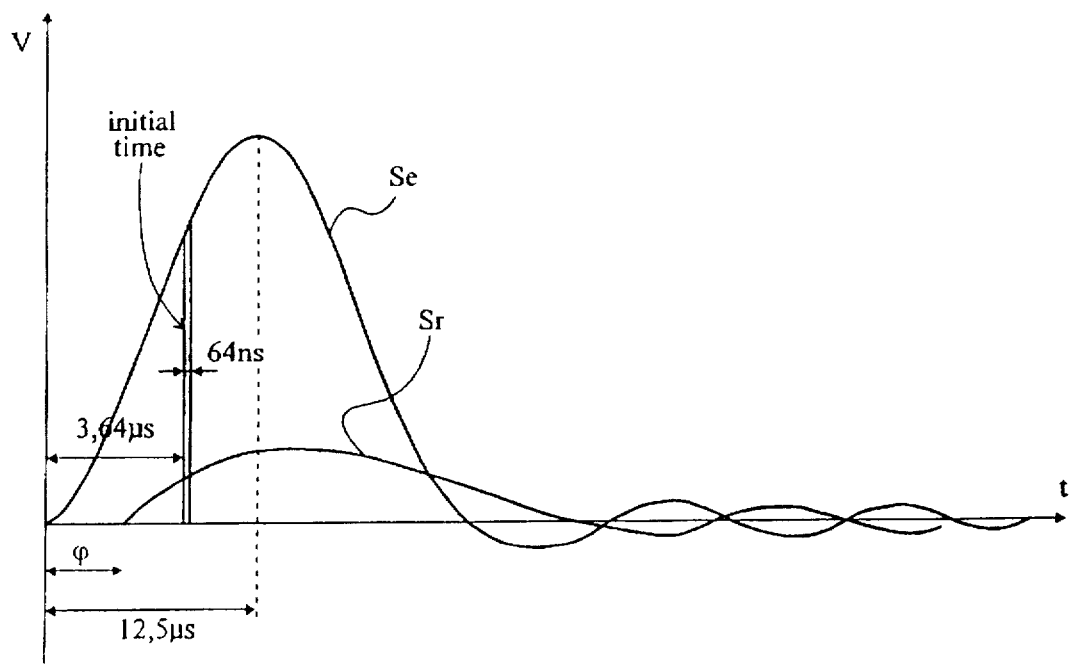
Figure 3:
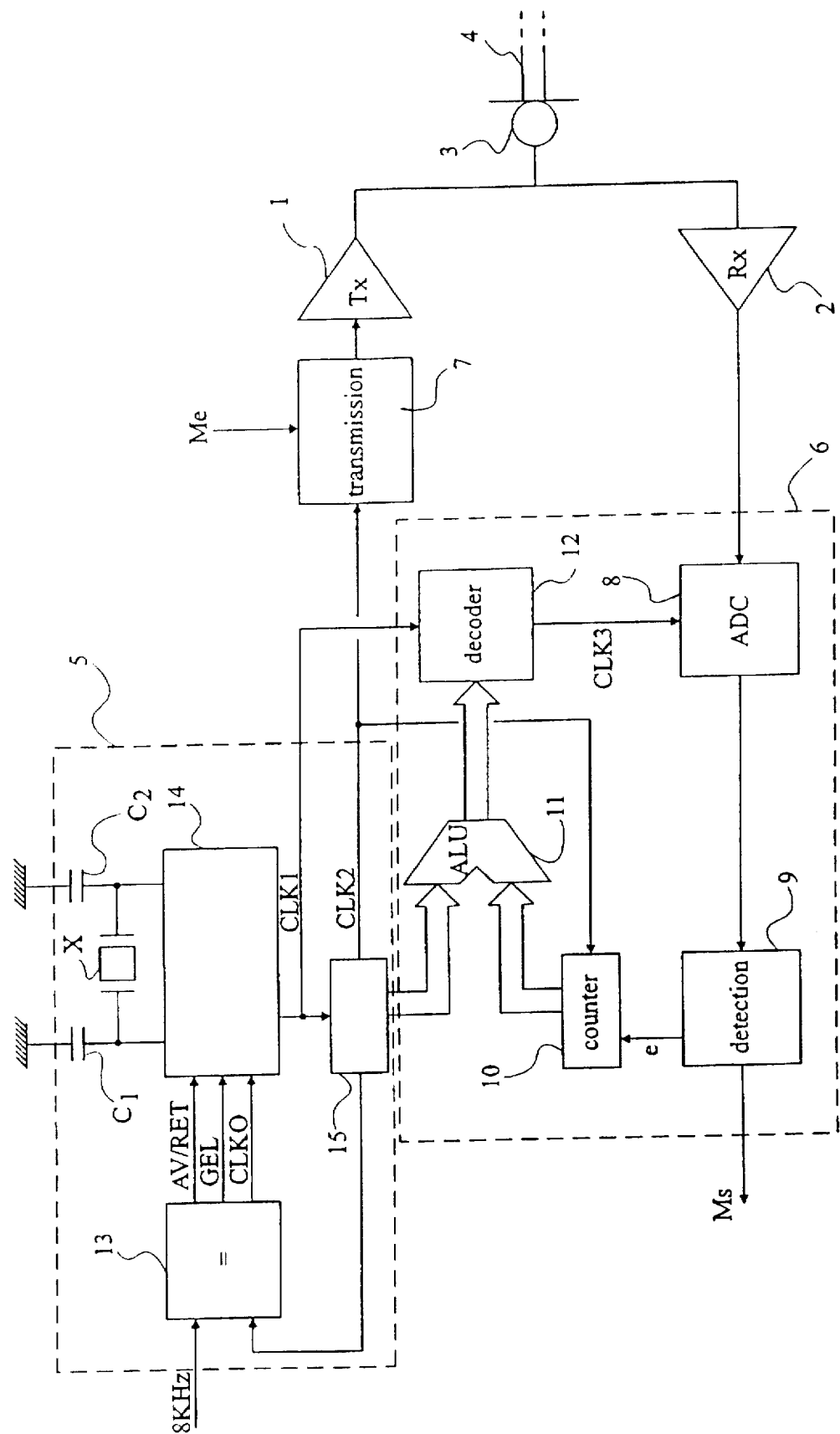
Figure 4:
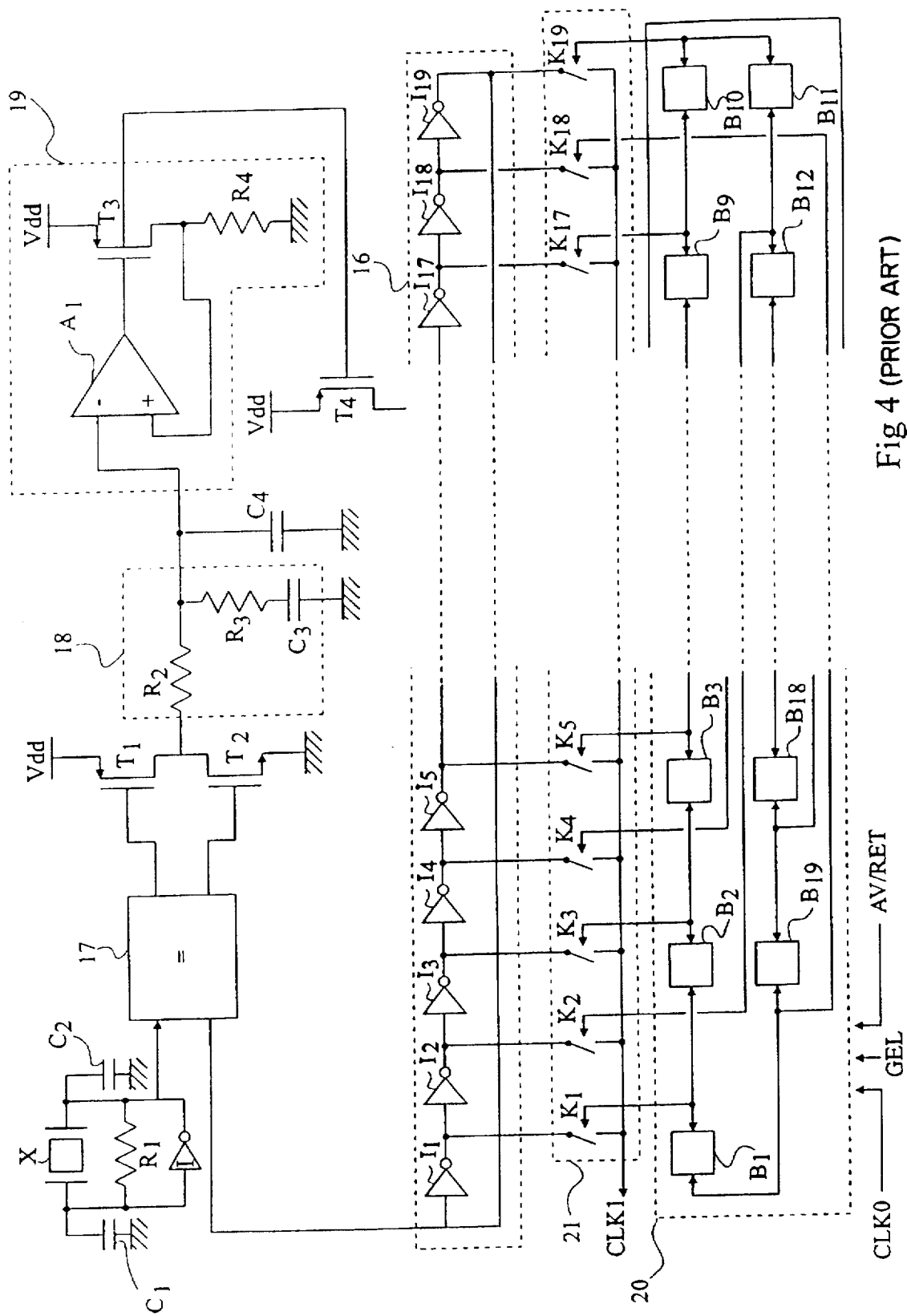
Figure 6:
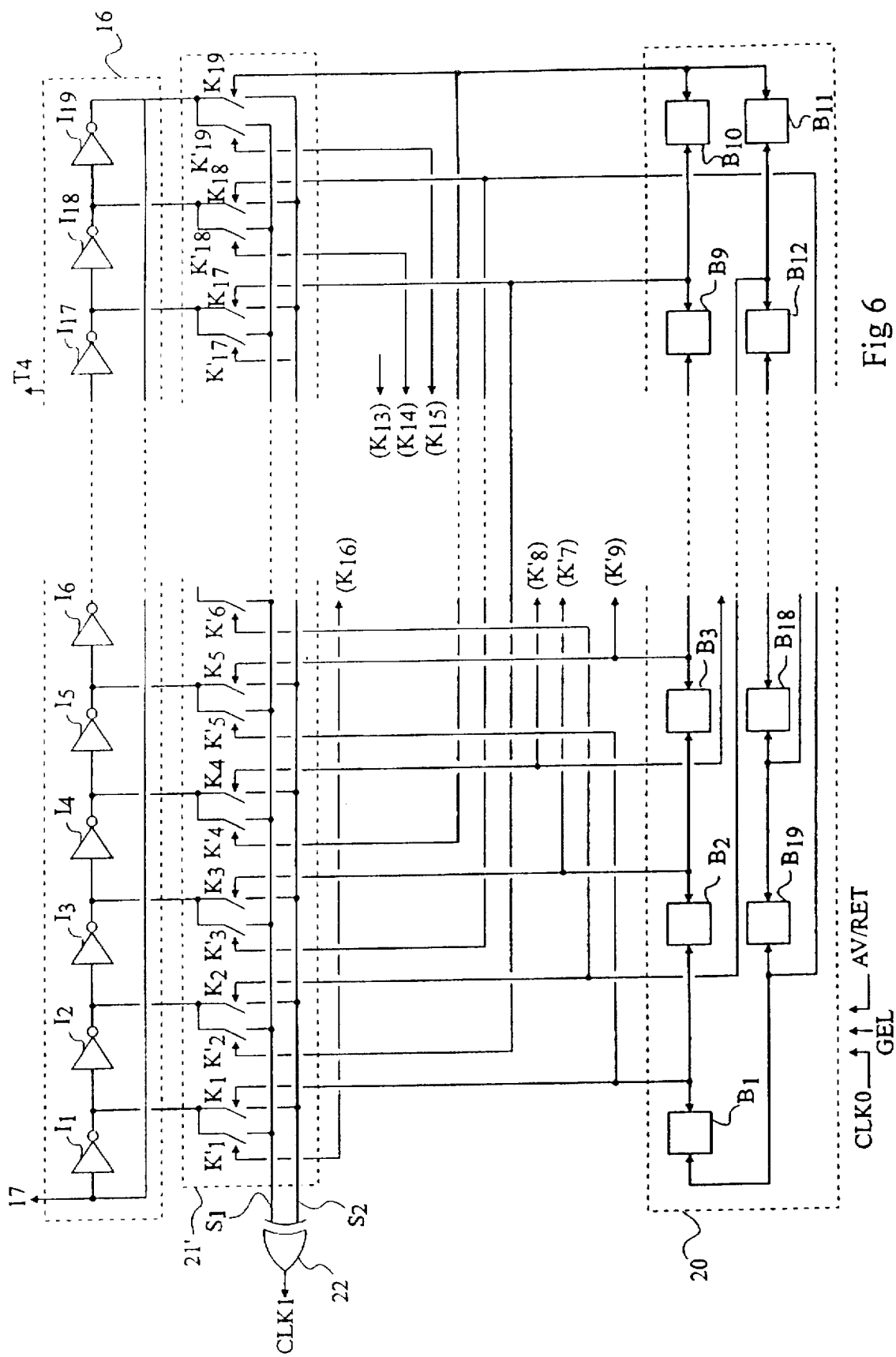
FIG. 6 represents a portion of a frequency synchronizing and multiplying circuit, according to the present invention.

According to a first embodiment of the invention, the multiplexer 21 of FIG. 4 is replaced with a multiplexer 21'. As shown in FIG. 6, multiplexer 21' now has two outputs S1 and S2, both providing a 15.36-MHz frequency signal drawn from the ring oscillator 16. The two outputs S1 and S2 are mutually shifted by 13.6 ns corresponding to the propagation time of four inverters. Indeed, the state of a flip-flop B(j) of register 20 is used both to control a switch K(i) of a first series and to provide an output signal S1 drawn from an inverter I(i) as previously, and also to control another switch K' (i+4) or a second series which provides a second signal S2 drawn in the present case from the output of an inverter I(i+4). The two signals S1 and S2 are provided to a logic "Exclusive-OR" (EXOR) gate 22 which provides signal CLK1. For the sake of simplicity, only the ring oscillator 16, the multiplexer 21' and the shift register 20 are represented in FIG. 6. The phase-locked loop for biasing the ring oscillator 16 is not modified with respect to the embodiment shown in FIG. 4.

Figure 7:
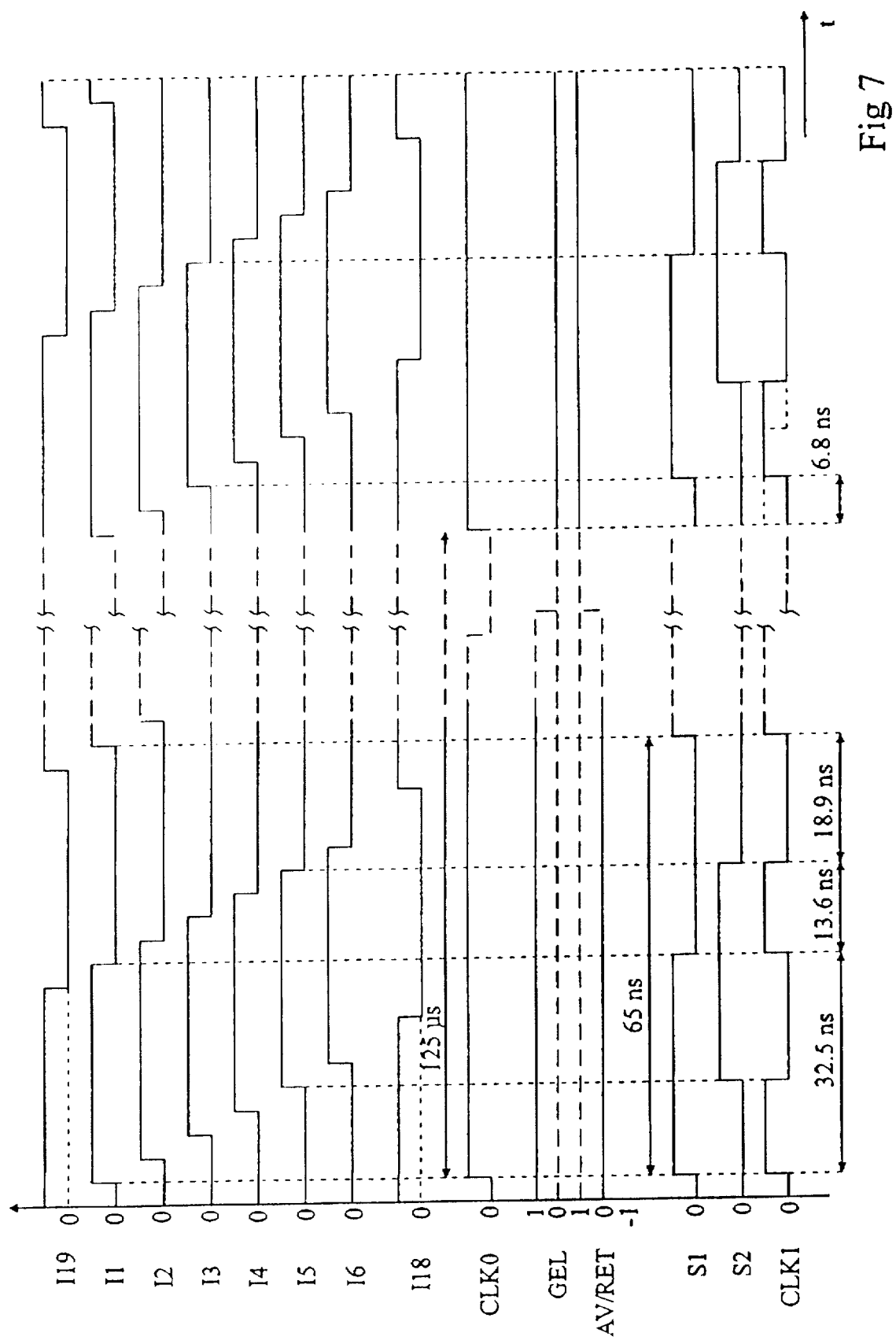
FIG. 7 shows timing diagrams of the correlation between the main signals of the synchronizing and multiplying circuit of FIG. 6.

FIG. 7 contains the timing diagrams of the outputs of inverters I(i), of the output signals S1 and S2 of multiplexer 21', and of signal CLK1. First, it is assumed that the circulating "1" of the shift register 20 is present in flip-flop B(1). Then, under the influence of a positive pulse of signal AV/RET generated by comparator 13, it is assumed that the circulating "1" is present in flip-flop B(2). Since the shift frequency of register 20 is determined by clock CLK0 to maintain synchronization on the 8-kHz signal, the phase difference of signal CLK1 is determined, if necessary, only every 12.5 μs.

As shown in FIG. 7, signal CLK1 first corresponds to the EXOR combination of the output signals of inverters I(1) and I(5), which are controlled by switches K(1) and K' (5), respectively. The synchronizing and multiplying circuit 14' remains in this state until a pulse of signal AV/RET occurs and until signal GEL is reset. Since the pulse of signal AV/RET is positive, the circulating "1" moves from flip-flop B(1) to flip-flop B(2), thus causing the switching off of switches K(1) and K' (5) and the switching on of switches K(3) and K' (7). Accordingly, signal CLK1 now corresponds to the combination of the output signals of inverters I(3) and I(7). Signal CLK1 is then delayed by 6.8 ns, which causes the 8 kHz frequency resynthetized by the counter 15' to be delayed so that it is locked back on the 8 kHz reference frequency of the telephone exchange.

According to the invention, the ALU 11' now adds on 9 bits the signals received from counter 15' and from the line delay counter 10'. Counter 15' has an additional stage so that it becomes a 9-bit counter and behaves like a divider by 384 to provide the 80-kHz signal CLK2. An additional bit is added to the line delay counter 10' to count on 9 bits. Therefore, the ALU now adds the value included in counter 10' to each state of counter 15'. Signal CLK1 is provided, as previously, as a clock signal to decoder 12, but it has a 30.72-MHz frequency. Now, decoder 12 detects the states 112 and 496, which causes, in case of phase skip, the skips to have a 32.5-ns duration. The sampling pulses of A/D converter 8 have a 32.5 ns width.

It is also possible not to add a stage to counter 15 and to provide it, as a clock signal, with signal S1 of the synchronizing and multiplying circuit 14'. It would then operate, as previously, as a counter/divider by 192. As a consequence, this would maintain sampling phase skips having a duration of 32.5 ns, which is determined by signal CLK1, but to maintain a 65-ns width of the sampling pulses.

Due to the propagation time of each inverter I(i), signal CLK1 is not a square wave signal but has pulses with a 13.6-ns width corresponding to the propagation time of four inverters I(i). Its quiescent time, determined by a difference with respect to the 15.36-MHz frequency, is therefore 18.9 ns. This is not a drawback since only the rising edges of the clock signal CLK1 are used for the operation of the transmission circuit.

Figure 8:
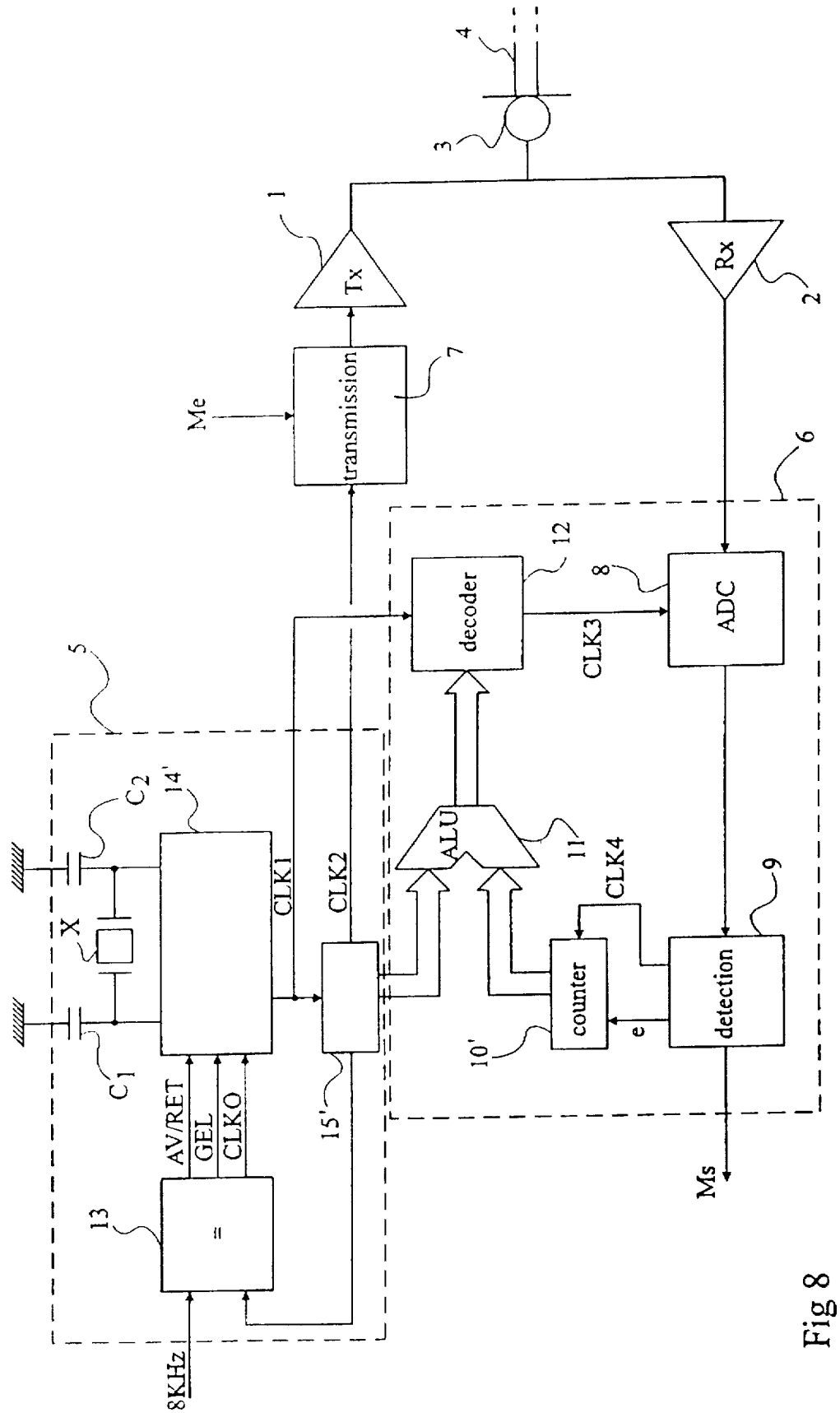
FIG. 8 represents a transmission circuit, according to the invention, of a 160-kbit signal according the 2B1Q standard.

According to a second aspect of the invention, as represented in FIG. 8, the clock input of the line delay counter 10' receives a signal CLK4 from the detection circuit 9. Signal CLK4 is locked on the detection of the first quaternary code of the synchronization words. In other words, the detection circuit 9 provides a pulse every first quaternary code of a simple or super-frame synchronization word, the pulse width being fixed by the 80-kHz frequency is then 12.5 μs. The emission of this signal does not impair the detection circuit 9 since its function is precisely to decode the received signal, the decoded frame being provided in this circuit.

Since a first code of a synchronization word occurs on the frame every 120 codes, the occurrence frequency of this first code of the synchronization word is 1.5 ms, which provides counter 10' with a clock frequency and therefore a counting frequency of approximately 666.6 Hz.

The phase error signal "e" has a zero, positive or negative value depending on the absence or presence (advance or lag) of a phase error. Therefore, the phase error signal sets counter 10' to an inhibited position, or to an up/down counting position, respectively. At each clock pulse CLK4, the value contained in counter 10' is then either unchanged, incremented, or decremented depending on the value of signal "e".

Figure 9:
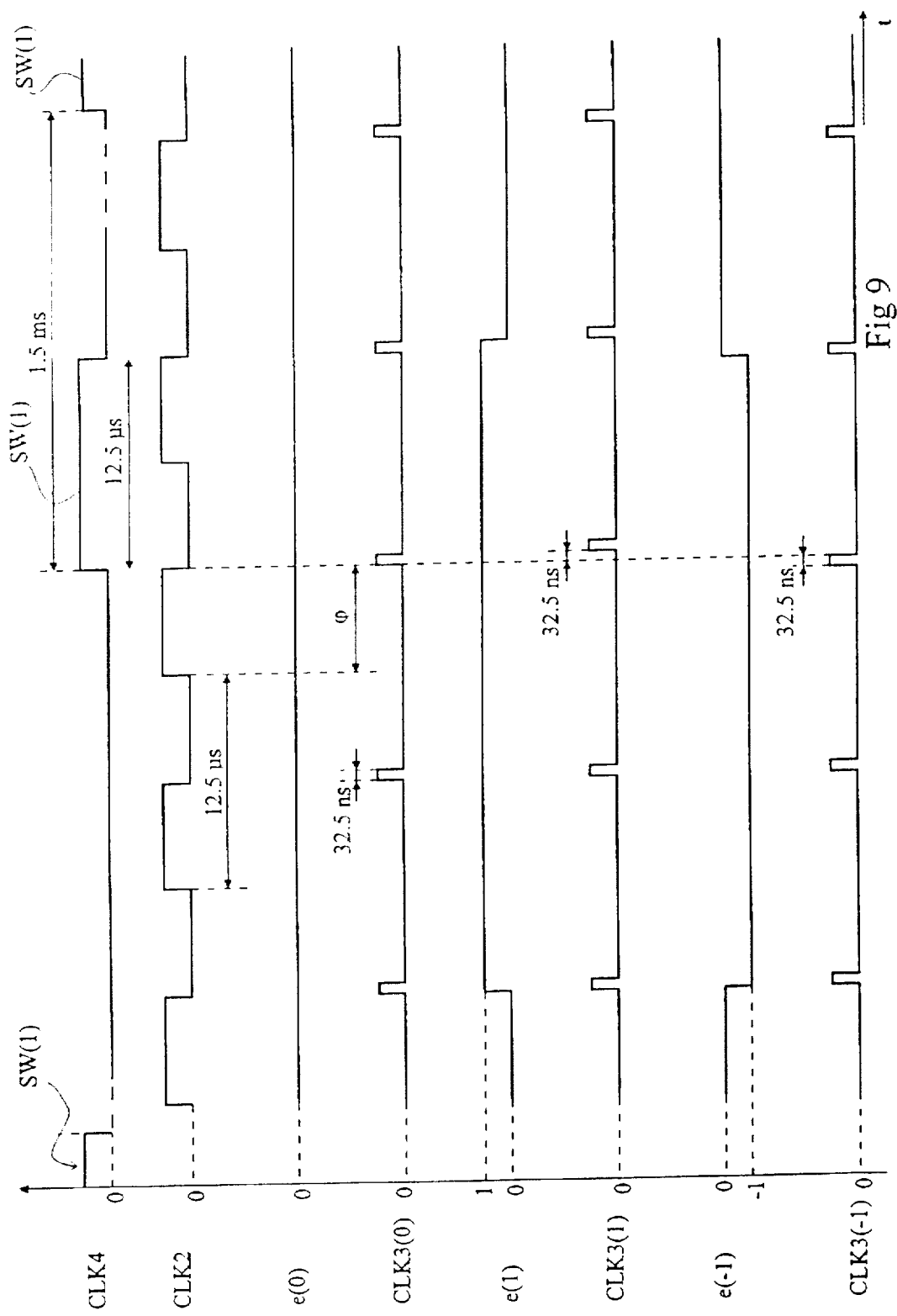
FIG. 9 shows schematic timing diagrams of the location of the phase skips with the circuit of FIG. 8.

FIG. 9, not drawn to scale for simplification, shows timing diagrams of the waveforms of signals CLK4 and CLK2, and the waveforms of signals "e" and CLK3, in the absence of a phase error, in the presence of a phase advance, and in the presence of a phase lag, respectively. For simplification of the drawing, the initial value of the phase shift φ between the emitted signal and the received signal is, in this example, 180° so that in the absence of a phase error signal CLK3 (0) is in phase with signal CLK2.

As can be seen in FIG. 9, a pulse of signal CLK4 has a 12.5-μs width and occurs at each first code SW (1) of a synchronization word, the frequency of these pulses being 1.5 ms. Signal CLK2 corresponds to the 80-kHz emission clock and has a 12.5-μs frequency.

The first error signal, e(0), is a signal indicating the absence of phase error. Accordingly, signal CLK3 (0) constituting the 80-kHz sampling signal with pulses having a 32.5-ns width is shifted by φ with respect to the emission clock CLK2.

In the case where the phase of the received signal is delayed with respect to this initial value, the error signal e(1) has a rising edge when this phase error is detected and therefore sets the line delay counter 10' in the up- counting mode. However, since the clock of counter 10' is provided by signal CLK4, the counter is incremented by 1 only upon the occurrence of the next clock pulse corresponding to the incoming of the first code SW(1) of a synchronization word. Signal CLK3 (1) is then shifted by a 32.5-ns value corresponding to the 30.72-MHz clock frequency of decoder 12.

If the phase of the received signal is advanced with respect to the initial value, the error signal e(−1) has a falling edge when it is detected and sets the line delay counter 10' in down-counting mode. As in the preceding case, the counter is incremented by 1 only at the occurrence of a pulse on signal CLK4, and signal CLK3 (−1) is then shifted in the reverse direction.

In both cases, e(1) and e(−1), signal "e" recovers its zero value as soon as the phase error has disappeared, that is, as soon as the value of counter 10' corresponds to the current phase shift between the emitted signal and the received signal.

As is apparent to those skilled in the art, various modifications can be made to the above disclosed preferred embodiments. More particularly, each component described above can be replaced with one or more elements fulfilling the same function.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A full duplex transmission circuit for correcting a phase jitter of a signal encoded according to lines and frames and having synchronization words alternating with data words, the circuit comprising:

a phase-locked loop including an oscillator that provides an oscillator signal having an oscillator frequency, a frequency synchronizer having a ring oscillator that reproduces the oscillator frequency to produce a sampling clock signal, and a frequency counter/divider, said phase-locked loop having a first output that provides an emission clock signal and a second output that provides the sampling clock signal, the emission clock signal and the sampling clock signal being synchronized with a reference clock signal having a reference frequency;

an analog to digital converter;

means for providing a sampling signal to the analog to digital converter, responsive to the sampling clock signal, the sampling signal having a phase locked to a phase shift between an emitted signal and a received signal, the sampling clock signal having a frequency that determines a duration of a phase skip of the sampling signal; and means for varying the frequency of the sampling clock signal to vary the duration of the phase skip of the sampling signal.

2. The transmission circuit of claim 1, wherein the ring oscillator produces a first signal and a second signal having a same frequency, and having phases offset by a phase difference, and wherein the frequency synchronizer further includes an "Exclusive Or" logic gate having a first input and a second input that respectfully receive the first signal and the second signal from the ring oscillator, the logic gate having an output that is the sampling clock signal.

3. The transmission circuit of claim 2, wherein the frequency synchronizer further includes, a multiplexer that selects the phase difference between the first signal and the second signal of the ring oscillator; and a circulating "1" type shift register coupled to the multiplexer to control the multiplexer.

4. The transmission circuit of claim 3, wherein the oscillator includes a quartz that provides the oscillator signal, and the frequency synchronizer further includes a loop for generating a bias current, and wherein:

the ring oscillator further includes n inverters biased by the bias current to control a phase of the oscillator signal;

the multiplexer further includes a first set of n switches and a second set of n switches, each switch of the first set of n switches and the second set of n switches having an input coupled to an output of a respective one of the n inverters, and having an output coupled to one of the respective inputs of the "Exclusive Or" logic gate;

the frequency synchronizer further includes n flip-flops for controlling the first set of n switches and the second set of n switches, an with flip-flop of the n flip-flops controlling an with switch from the first set of n switches and an (i+m)th switch from the second set of n switches, an (i+l)th flip-flop, adjacent the with flip-flop, controlling a (i+m/2)th switch of the first set of n switches and an (i+m+m/2)th switch of the second set of n switches, the first set of n switches and the second set of n switches being controlled such that at any given time only one switch of the first set, coupled to an with inverter of the n inverters, and a corresponding one switch of the second set, coupled to a (i+m)th inverter of the n inverters, is in a closed position, the ith inverter, in the closed position, providing the first signal to the first input of the logic gate through the one switch of the first set of n switches, and the (i+m)th inverter, in the closed position, providing the second signal to the second input of the logic gate through the corresponding one switch of the second set of n switches, the phase difference between the first signal and the second signal corresponding to a propagation time of m inverters; and the sampling clock signal provided by the logic gate has a frequency equal to twice the quartz frequency.

5. The transmission circuit of claim 4, wherein:

said phase-locked loop further includes a comparator which generates a comparator signal based on a difference in phase between the reference clock signal and the sampling clock signal;

the shift register is controlled by the reference clock signal, and a shift of a state "1" in the shift register from an ith flip-flop of the n flip-flops to a next (i+1)th flip-flop or to a preceding (i−1)th flip-flop is controlled by the comparator signal to synchronize the sampling clock signal with the reference clock signal.

6. The transmission circuit of claim 5, further comprising:

a line delay counter having an output that provides a value of a phase shift between an emitted signal and a received signal, an up/down counting frequency of said line delay counter corresponding to a frequency of the synchronization words in the frames;

an arithmetic and logic unit having a first input coupled to the output of the line delay counter and a second input coupled to an output of the frequency counter/divider, and an output that provides a sum of the first input and the second input; and decoder having an input coupled to the output of the arithmetic and logic unit, and having an output that provides the sampling signal based upon the result of the arithmetic and logic unit.

7. The transmission circuit of claim 6, further comprising:

a detector for detecting the received signal, having a first output that provides a phase shift signal indicating the presence and direction of the phase shift between the emitted signal and the received signal, and having a second output that provide s a pulse signal having an amplitude corresponding to an amplitude of a received code, and an occurrence frequency corresponding to a frequency of the synchronization words in the frames; and wherein said line delay counter further includes a first input coupled to the first output of the detector to receive the phase shift signal, and a second input coupled to the second output of the detector to receive the pulse signal.

8. The transmission circuit of claim 7, wherein the detector provides the pulse signal upon the occurrence of a first code of each synchronization word.

9. The transmission circuit of claim 8, wherein the received signal has a data rate of 160 kbits/second and is encoded according to a 2B1Q standard.

10. The transmission circuit of claim 9, wherein said ring oscillator includes nineteen inverters, the first set of switches and the second set of switches of said multiplexer each contain 19 switches, said shift register includes nineteen flip-flops, the phase shift between the first and second signals of the inverters corresponds to the propagation time of four inverters, the emission clock signal and the sampling signal have a frequency of 80 kHz, the sampling clock signal has a frequency of 30.72 MHz, the occurrence frequency of the pulse signal is 666.6 Hz, and the sampling pulses and the phase skips have a duration of 32.5 ns.

11. The transmission circuit of claim 1, wherein the received signal has a data rate of 160 kbits/second, and is encoded according to a 2B1Q standard.

12. The transmission circuit of claim 1, further comprising:

a line delay counter having an output that provides a value of a phase shift between an emitted signal and a received signal, an up/down counting frequency of said line delay counter corresponding to a frequency of the synchronization words in the frames;

an arithmetic and logic unit having a first input coupled to the output of the line delay counter and a second input coupled to an output of the frequency counter/divider, and an output that provides a sum of the first input and the second input; and a decoder having an input coupled to the output of the arithmetic and logic unit, and having an output that provides the sampling signal based upon the result of the arithmetic and logic unit.

13. The transmission circuit of claim 1, further comprising:

a transmission unit for modulating a transmit signal with a data signal, having a first input coupled to the second output of the phase-locked loop to receive the emission clock signal, a second input that receives the data signal, and an output that provides the transmit signal.

14. The transmission circuit of claim 13, further comprising:

a transformer for coupling electrical signals between the transmission circuit and a transmission system, having an input coupled to the output of the transmission unit, an output coupled to the analog to digital converter, and an input/output port to couple the transmission circuit to the transmission system.

15. The transmission circuit of claim 10, further comprising:

a transmission unit for modulating a transmit signal with a data signal, having a first input coupled to the second output of the phase-locked loop to receive the emission clock signal, a second input that receives the data signal, and an output that provides the transmit signal.

16. The transmission circuit of claim 15, further comprising:

a transformer for coupling electrical signals between the transmission circuit and a transmission system, having an input coupled to the output of the transmission unit, an output coupled to the analog to digital converter, and an input/output port to couple the transmission circuit to the transmission system.

17. A method for correcting a phase of a received signal in a transmission circuit comprising the steps of:

A. comparing the phase of the received signal with a reference signal to determine a phase error of the received signal;

B. applying a phase skip to the received signal to correct the phase error of the received signal, the phase skip being generated from a sampling clock signal;

C. varying the duration of the phase skip by varying the frequency of the sampling clock signal.

18. The method of claim 17, further comprising the steps of:

detecting the presence of synchronization words in the received signal; and positioning the phase skips on the synchronization words of the received signal.

19. The method of claim 18, wherein the phase skips are positioned on a first code of each synchronization word of the received signal.

20. The method of claim 19, wherein the phase skips have a selectable duration of either 32.5 nanoseconds or 65 nanoseconds.

21. The method of claim 18, wherein a phase skip is applied only once every 10 synchronization words to avoid desynchronization and to optimize the reliability of the circuit.

22. A transmission circuit for correcting a phase error of a received signal, the transmission circuit comprising:

a phase-locked loop for providing a sampling clock signal that is synchronized to a reference clock signal, the sampling clock signal having a frequency that is variable;

an analog to digital converter for sampling the received signal in response to a sampling signal, having a first input that receives the received signal and having a second input that receives the sampling signal;

a decoder having a first input coupled to the output of the phase-locked loop for receiving the sampling clock signal, a second input for receiving a phase shift value, and an output coupled to the second input of the analog to digital converter that provides the sampling signal, the decoder providing phase skips in the sampling signal based upon the phase shift value to correct the phase error of the received signal, a duration of the phase skips being determined by the frequency of the sampling clock signal.

23. The transmission circuit of claim 22, wherein the phase-locked loop further includes a frequency synthesizer having a ring oscillator for producing a first signal and a second signal, the first signal and the second signal having a same frequency, and having respective phases offset by a phase difference, the frequency synthesizer further having an "Exclusive Or" logic gate, the "Exclusive Or" logic gate having a first input and a second input that respectfully receive the first signal and the second signal from the ring oscillator, and an output for providing the sampling clock signal, the frequency of the sampling clock signal being substantially twice the same frequency of the first signal and the second signal.

24. The transmission circuit of claim 23, wherein the frequency synthesizer further includes, a multiplexer that selects the phase difference between the first signal and the second signal of the ring oscillator, and a circulating "1" type shift register coupled to the multiplexer to control the multiplexer.

25. The transmission circuit of claim 24, wherein the frequency synthesizer further includes a quartz that provides a quartz signal having a quartz frequency, and a loop for generating a bias current, and wherein:

the ring oscillator is responsive to the quartz signal and further includes n inverters biased by the bias current to control a phase of the quartz signal.

26. The transmission circuit of claim 25, wherein the multiplexer further includes a first set of n switches and a second set of n switches, each switch of the first set of n switches and the second set of n switches having an input coupled to an output of a respective one of the n inverters, and having an output coupled to one of the respective inputs of the "Exclusive Or" logic gate.

27. The transmission circuit of claim 25, wherein the frequency synthesizer further includes n flip-flops for controlling the first set of n switches and the second set of n switches, an ith flip-flop of the n flip-flops controlling an ith switch from the first set of n switches and an (i+m)th switch from the second set of n switches, an (i+1)th flip-flop, adjacent the ith flip-flop, controlling a (i+m/2)th switch of the first set of n switches and an (i+m+m/2)th switch of the second set of n switches, the first set of n switches and the second set of n switches being controlled such that at any given time only one switch of the first set, coupled to an ith inverter of the n inverters, and a corresponding one switch of the second set, coupled to a (i+m)th inverter of the n inverters, is in the closed position, the ith inverter providing the first signal to the first input of the logic gate through the one switch of the first set of n switches, and the (i+m)th inverter providing the second signal to the second input of the logic gate through the corresponding one switch of the second set of n switches, the phase difference between the first signal and the second signal corresponding to a propagation time of m inverters.

28. The transmission circuit of claim 27, wherein said phase-locked loop further includes a comparator for comparing the reference clock signal and the sampling clock signal and for outputting a comparator signal based on a difference in phase between the reference clock signal and the sampling clock signal;

29. The transmission circuit of claim 28, wherein the shift register is responsive to the reference clock signal and shifts a state "1", in the shift register, from an ith flip-flop, of the n flip-flops, to a next (i+1)th flip-flop or to a preceding (i−1)th flip-flop in response to the comparator signal to synchronize the sampling clock signal with the reference clock signal.

30. The transmission circuit of claim 29, further comprising a line delay counter having an output that provides a value of a phase shift between an emitted signal and the received signal, an up/down counting frequency of said line delay counter corresponding to a frequency of the synchronization words in the frames.

31. The transmission circuit of claim 30, further comprising an arithmetic and logic unit having a first input coupled to the output of the line delay counter and a second input coupled to an output of the phase-locked loop, and an output that provides a sum of the first input and the second input.

32. The transmission circuit of claim 31, wherein the received signal is encoded according to lines and frames having synchronization words alternating with data words, the transmission circuit further comprising:

a detector for detecting the received signal, having a first output that provides a phase shift signal indicating the presence and direction of the phase shift between the emitted signal and the received signal, and having a second output that provides a pulse signal having a pulse width corresponding to a duration of a received code, and an occurrence frequency corresponding to the frequency of the synchronization words in the frames; and wherein said line delay counter further includes a first input coupled to the first output of the detector to receive the phase shift signal, and a second input coupled to the second output of the detector to receive the pulse signal.

33. The transmission circuit of claim 32, wherein the detector provides the pulse signal upon the occurrence of a first code of each synchronization word.

34. The transmission circuit of claim 33, wherein the received signal has a data rate of 160 kbits/second and is encoded according to a 2B1Q standard.

35. The transmission circuit of claim 34, wherein the phase-locked loop has a second output that provides an emission clock signal, the transmission circuit further comprising:

a transmission unit for modulating a transmit signal with a data signal, having a first input coupled to the second output of the phase-locked loop to receive the emission clock signal, a second input that receives the data signal, and an output that provides the transmit signal.

36. The transmission circuit of claim 34, wherein said ring oscillator includes nineteen inverters, the first set of switches and the second set of switches of said multiplexer each contain 19 switches, said shift register includes nineteen flip-flops, the phase shift between the first and second signals of the inverters corresponds to the propagation time of four inverters, the emission clock signal and the sampling signal have a frequency of 80 kHz, the sampling clock signal has a frequency of 30.72 MHz, the occurrence frequency of the pulse signal is 666.6 Hz, and the sampling pulses and the phase skips have a duration of 32.5 ns.

37. The transmission circuit of claim 36, further comprising:
   a transformer for coupling electrical signals between the transmission circuit and a transmission system, having an input coupled to the output of the transmission unit, an output coupled to the first input of the analog to digital converter, and an input/output port to couple the transmission circuit to the transmission system.

38. The transmission circuit of claim 26, wherein the phase-locked loop has a second output that provides an emission clock signal, the transmission circuit further comprising:
   a transmission unit for modulating a transmit signal with a data signal, having a first input coupled to the second output of the phase-locked loop to receive the emission clock signal, a second input that receives the data signal, and an output that provides the transmit signal.

39. The transmission circuit of claim 38, further comprising:
   a transformer for coupling electrical signals between the transmission circuit and a transmission system, having an input coupled to the output of the transmission unit, an output coupled to the first input of the analog to digital converter, and an input/output port to couple the transmission circuit to the transmission system.

40. A telephone line transmission system for providing full duplex communication and for correcting a phase error of a received signal comprising:
   a phase-locked loop having an output that provides a sampling clock signal, the sampling clock signal having a frequency that is variable;
   an analog to digital converter for sampling the received signal in response to a sampling signal, having a first input that receives the received signal and having a second input that receives the sampling signal;
   a decoder having a first input, coupled to the output of the phase-locked loop, for receiving the sampling clock signal, a second input for receiving a phase shift value, and an output coupled to the second input of the analog to digital converter that provides the sampling signal, the decoder providing phase skips in the sampling signal based upon the phase shift value to correct the phase error of the received signal, a duration of the phase skips being determined by the frequency of the sampling clock signal;
   a transmission unit for modulating a transmit signal with a data signal, having a first input coupled to the second output of the phase-locked loop to receive the emission clock signal, a second input that receives the data signal, and an output that provides the transmit signal; and
   a transformer for coupling electrical signals between a transmission circuit and the transmission system, having an input coupled to the output of the transmission unit, an output coupled to the first input of the analog to digital converter, and an input/output port to couple the transmission circuit to the transmission system.

* * * * *